United States Patent
Elliott et al.

[11] Patent Number: 6,147,410
[45] Date of Patent: Nov. 14, 2000

[54] ELECTRONIC COMPONENT AND METHOD OF MANUFACTURE

[75] Inventors: Alexander J. Elliott, Tempe; Timothy E. Meko, Chandler; Gary R. Lorenzen, Phoenix; Kent Lamar Kime, Phoenix; Prosanto K. Mukerji, Phoenix; Keith W. Bailey, Mesa; William L. Fragale, Scottsdale; Pablo Rodriguez, Gilbert; George C. Chen, Chandler, all of Ariz.

[73] Assignee: Motorola, Inc., Schaumburg, Ill.

[21] Appl. No.: 09/033,188

[22] Filed: Mar. 2, 1998

[51] Int. Cl.⁷ .................................................. H01L 23/48
[52] U.S. Cl. .......................... 257/776; 257/773; 257/774
[58] Field of Search ................................... 257/666, 773, 257/774, 775, 776, 693, 698

[56] References Cited

U.S. PATENT DOCUMENTS

| | | |
|---|---|---|
| 3,061,766 | 10/1962 | Kelley . |
| 3,153,750 | 10/1964 | Ackerman . |
| 5,110,761 | 5/1992 | Kalfus et al. . |
| 5,218,231 | 6/1993 | Kudo .......................................... 257/735 |
| 5,665,996 | 9/1997 | Williams et al. . |
| 5,894,170 | 4/1999 | Ishikawa .................................. 257/774 |

*Primary Examiner*—Sheila V. Clark
*Attorney, Agent, or Firm*—Anthony M. Martinez

[57] ABSTRACT

An electronic component includes a semiconductor substrate (101, 301, 401), an electrically conductive layer (102, 103, 302, 303, 402, 403) supported by the semiconductor substrate (101, 301, 401), and a lead (110, 120, 210, 310, 410, 420) having an electrical coupling portion (112, 122, 212, 312, 412, 422) coupled to and supported by the electrically conductive layer (102, 103, 302, 303, 402, 403) wherein the electrical coupling portion (112, 122, 212, 312, 412, 422) has at least one notch (115, 215, 315) adjacent to the electrically conductive layer (102, 103, 302, 303, 402, 403).

18 Claims, 2 Drawing Sheets

ELECTRONIC COMPONENT AND METHOD OF MANUFACTURE

BACKGROUND OF THE INVENTION

This invention relates, in general, to electronic components, and more particularly, to electrical interconnects of electronic components.

Wire bonds are often used to electrically couple a semiconductor device to a leadframe. However, a single wire bond is not suitable for use with high currents. Therefore, high current components must use multiple wire bonds, which increases the cost and complexity of the electronic components.

Discrete diodes use large axial leads to provide high current carrying capability, but such axial leads are not suitable for electronic components having more than two electrodes or terminals.

Occasionally, a high current carrying clip is used in place of multiple wire bonds. However, electronic components using wire bonds or clips still have high parasitic on-resistance.

Accordingly, a need exists for electronic components having electrical interconnects with high current carrying capabilities and low parasitic on-resistances.

BRIEF DESCRIPTION OF THE DRAWINGS

For simplicity and clarity of illustration, elements in the drawings are not necessarily drawn to scale. Furthermore, the same reference numerals in different figures denote the same elements.

DETAILED DESCRIPTION OF THE DRAWINGS

Figure 1:
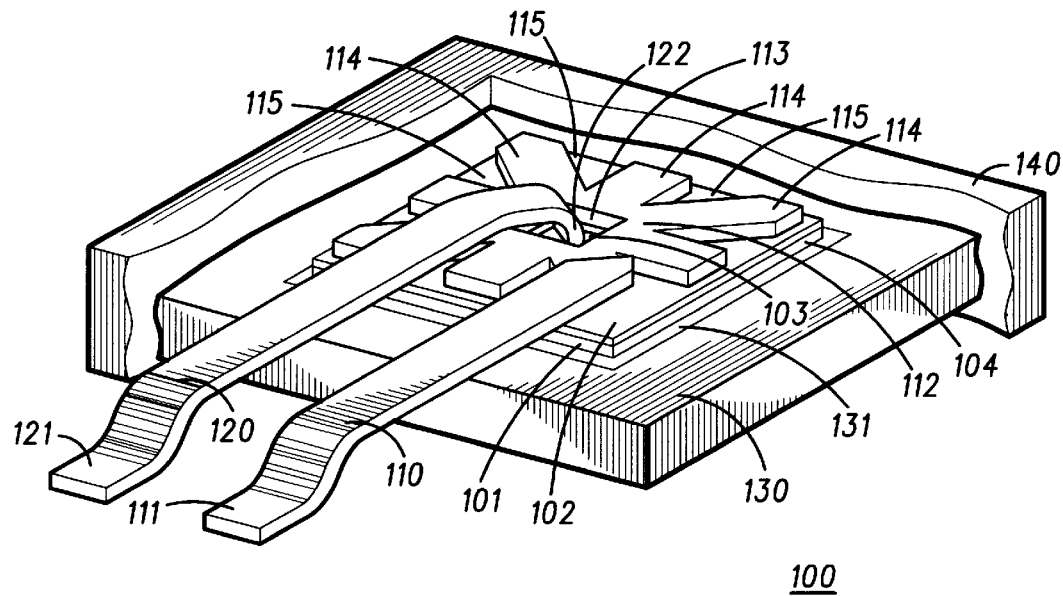
FIG. 1 illustrates a cut-away isometric view of a first embodiment of an electronic component in accordance with the present invention.

FIG. 1 illustrates a cut-away isometric view of an electronic or semiconductor component 100. Component 100 generally includes, among other features, a device substrate 101, electrical interconnects or leads 110 and 120, a mounting or support substrate 130, and a packaging material 140.

Substrate 101 is comprised of a semiconductor substrate such as silicon, gallium arsenide, or the like. At least one semiconductor device 104 is formed in a top surface of substrate 101 using semiconductor manufacturing techniques known in the art. In the preferred embodiment, device 104 is a single power transistor such as an insulated gate bipolar transistor (IGBT). Alternatively, a bipolar-complimentary-metal-oxide-semiconductor (BiCMOS) integrated circuit or the like could be formed in substrate 101.

Electrically conductive layers 102 and 103 are formed over device 104 and supported by the top surface of substrate 101. Layer 102 has a hole in which layer 103 is located, and layers 102 and 103 can be coplanar with each other. Layers 102 and 103 are electrically coupled to different portions of device 104. In the preferred embodiment, layer 102 serves as a high current emitter electrode for device 104, and layer 103 serves as a lower current base electrode for device 104.

Layers 102 and 103 can be formed by electroplating or otherwise depositing a metal layer over substrate 101 and then dividing the metal layer into two physically separated regions (i.e., layers 102 and 103) by an etching process. Alternatively, layers 102 and 103 can be sequentially, instead of simultaneously, formed over substrate 101.

Substrate 101 is disposed over support substrate 130, which is larger than substrate 101. In particular, the front or top surface of substrate 101 faces away from substrate 130 while the back or bottom surface of substrate 101 is mounted on an electrically conductive mounting region 131 of substrate 130. In the preferred embodiment, region 131 is electrically coupled to the collector of device 104 by solder or another electrically conductive adhesive. Substrate 130 can be electrically insulative, and electrically conductive mounting region 131 can extend through substrate 130 to serve as an electrical lead at a backside surface of substrate 130.

Lead 110 is electrically coupled to device 104 through electrically conductive layer 102. In particular, lead 110 has an electrical coupling portion 112 mounted on and supported by an electrical coupling portion or bonding or contact region of layer 102. Portion 112 is also referred to as an attachment portion.

In the preferred embodiment, layer 102 itself is comprised of solder. However, in an alternative embodiment, a separate electrically conductive adhesive can be used to physically and electrically couple electrical coupling portion 112 to the bonding region of layer 102. In component 100, the bonding region of layer 102 is the entire top surface of layer 102. However, in an alternative embodiment where a passivation layer (not shown) covers a portion of the top surface of substrate 101 and also covers an outer perimeter of layer 102, the bonding region of layer 102 is less than the entire top surface of layer 102 and is only a central portion of the top surface of layer 102.

In order to reduce the parasitic on-resistance of component 100, electrical coupling portion 112 is shaped to maximize a coupling surface area between the bonding region of layer 102 and electrical coupling portion 112 of lead 110. Maximizing the coupling surface area decreases the sheet resistance, which reduces the parasitic on-resistance of component 100. As an example, portion 112 covers at least seventy percent of the surface area of the bonding region of layer 102. In the preferred embodiment, portion 112 covers at least ninety percent of the surface area of the bonding region to reduce the parasitic on-resistance of component 100. Portion 112 preferably does not cover any portion of layer 103 to reduce the possibility of accidentally electrically shorting together layers 102 and 103.

The shape of portion 112 promotes mechanical interlocking with an encapsulant, as explained in more detail hereinafter. Portion 112 is larger or wider than other portions of lead 110, including a distal end or portion 111 located at an opposite end of lead 110. The wider configuration of portion 112 improves or reduces the aforementioned parasitic on-resistance of component 100.

Portion 112 has a plurality of protrusions, fingers, or ends 114 defining a plurality of slots or notches 115 therebetween. The specific configuration of ends 114 and notches 115 depicted in FIG. 1 is for illustration purposes only and is not intended to limit the scope of the present invention. In FIG. 1, ends 114 and notches 115 are at a perimeter of portion 112 and are adjacent to and overlie layer 102. Each of ends 114 have a surface substantially parallel to the bonding region of layer 102 in order to maximize the coupling surface area between the bonding region of layer 102 and lead 110. The presence of notches 115 over layer 102 reduces the reliability failures of component 100 caused by the thermal expansion differences between substrate 101 and lead 110.

Portion 112 also has a through-hole 113 at its center wherein hole 113 extends entirely through portion 112 and wherein hole 113 exposes and provides access to layer 103. Hole 113 is preferably concentric with the hole of layer 102. Although not depicted in FIG. 1, hole 113 can also expose a central portion of layer 102.

Lead 120 is inserted into hole 113 and is electrically coupled to device 104 though layer 103. In particular, lead 120 has an electrical coupling portion 122 mounted on and supported by an electrical coupling portion or bonding region of layer 103. The bonding regions of layers 102 and 103 are similar to each other, and the bonding region of layer 103 can be coupled to portion 122 of lead 120 in a manner similar to the coupling of the bonding region of layer 102 and portion 112 of lead 110. A distal portion 121 of lead 120 is at an opposite end from electrical coupling portion 122.

Leads 110 and 120 are not electrically shorted together through layers 102 or 103 or through substrate 101 to permit proper electrical operation of device 104. Leads 110 and 120 can have a minimum cross-sectional area larger than that of a conventional wire bond to increase the current carrying capabilities of leads 110 and 120. Leads 110 and 120 can be comprised of copper, aluminum, gold, nickel-iron, or other malleable and electrically conductive material. Leads 110 and 120 can be formed by stamping, coining, or otherwise deforming a sheet of electrically conductive material into the shapes depicted in FIG. 1.

Packaging material 140 covers or surrounds substrate 101, electrically conductive layers 102 and 103, portion 112 of lead 110, and portion 122 of lead 120. Material 140 can be a high pressure injection molded encapsulant, a glob top material, or the like. Substrate 101 supports a portion of material 140; portion 111 of lead 110 protrudes or extends out of material 140; and portion 121 of lead 120 protrudes or extends out of material 140. As illustrated in FIG. 1, material 140 can fully surround substrate 130. In this embodiment, electrically conductive region 131 extends through substrate 130, protrudes from the back surface of substrate 130, and is coplanar with material 140 at the backside of component 100 to provide an external electrical connection to device 104. In an alternative embodiment, material 140 can merely rest on top of substrate 130 while region 131 is coplanar with the back surface of substrate 130 to provide an external electrical connection to device 104.

As explained earlier, the perimeter of portion 112 of lead 110 has ends 114 and notches 115, which serve as a mold-locking feature by improving the mechanical interlocking between material 140 and lead 110. Ends 114 and notches 115 can be used in addition to conventional mold-locking features, which are not illustrated in FIG. 1 in order to simplify the explanation of component 100. Ends 114 and notches 115 maintain an orientation of lead 110 relative to substrates 101 and 130 because material 140 is disposed in notches 115 between ends 114. The specific size and configuration of notches 115 can be adjusted to improve the overall cosmetic appearance of packaging material 140. In an alternative embodiment, ends 114 and notches 115 extend beyond layer 102 and substrate 101 to form a gap between lead 110 and substrate 130 to enhance the mold-locking function of ends 114 and notches 115. In another alternative embodiment, electrical coupling portion 122 can have similar mold-locking features as electrical coupling portion 112.

Figure 2:
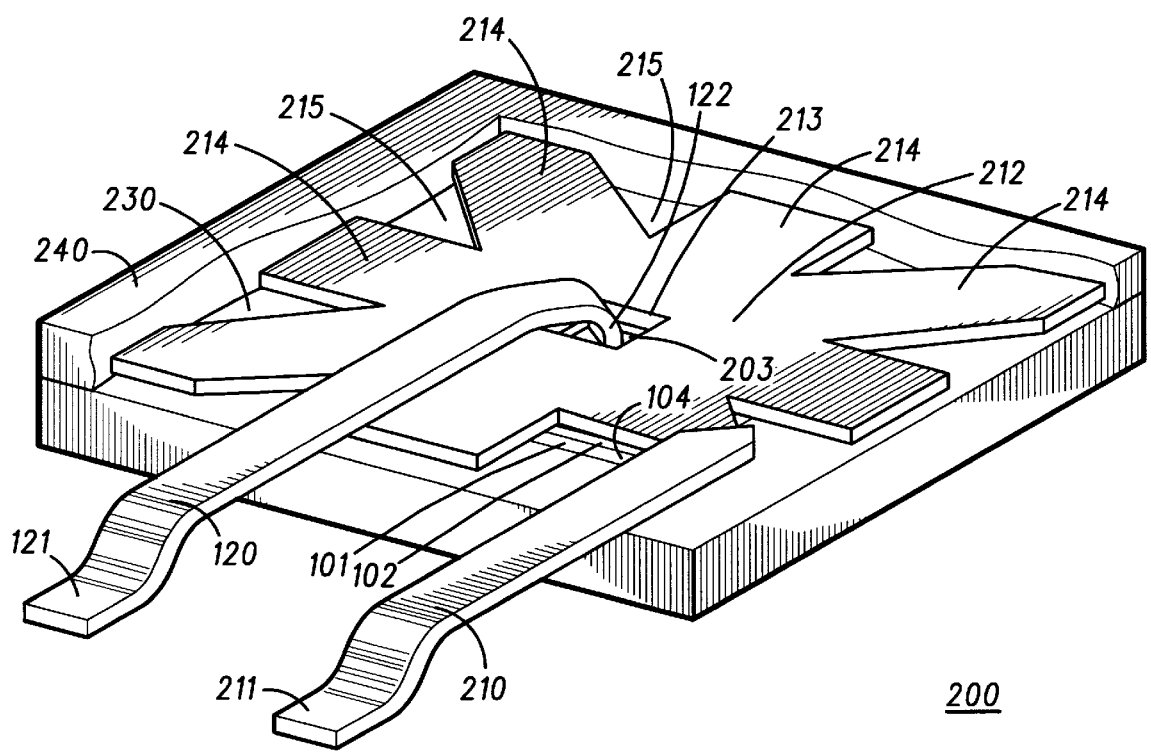
FIG. 2 illustrates a cut-away isometric view of an alternative embodiment of the electronic component of FIG. 1.

FIG. 2 illustrates a cut-away isometric view of an electronic component 200, which is an alternative embodiment of component 100 in FIG. 1. Component 200 has an electrical interconnect or lead 210, which is similar to lead 110 of component 100. Lead 210 has a distal portion 211 opposite an electrical coupling portion 212. Portion 212 has a through-hole 213 at a central portion and has protrusions, fingers, or ends 214 defining slots or notches 215 therebetween. Portion 212 of lead 210 is larger than portion 112 of lead 110. In particular, ends 214 and notches 215 extend beyond and do not overlie layer 102 or substrate 101. Therefore, portion 212 of lead 210 is larger than layer 102.

Support substrate 230 is similar to substrate 130 of component 100, but substrate 230 is electrically conductive and serves as a third electrode for component 200. With a packaging material 240 resting entirely on top of substrate 230, component 200 can be a surface mount device wherein the bottom surfaces of distal portions 121 and 211 of leads 120 and 210, respectively, are coplanar with the bottom surface of substrate 230.

In order to provide high voltage operation for component 200, the body or central region of leads 120 and 210 are disposed further away from substrate 230 than electrical coupling portions 122 and 212 of leads 120 and 210, respectively. To further improve the high voltage operation of component 200, ends 214 of portion 212 can be bent upwards and away from layer 102 and substrates 101 and 230 to provide a larger distance between the collector and emitter electrodes of component 200. The bent configuration of ends 214 can be similar to the bent configuration of the body or central region of leads 120 and 210.

Figure 3:
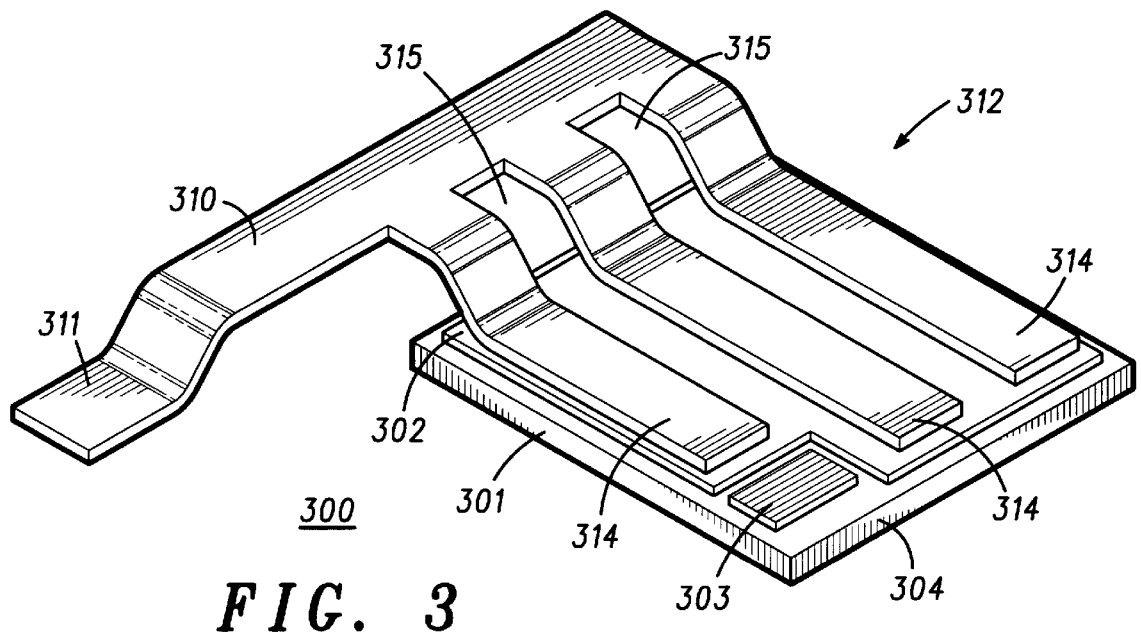
FIG. 3 illustrates an isometric view of a portion of a different embodiment of an electronic component in accordance with the present invention.

FIG. 3 illustrates an isometric view of a portion of an electronic component 300. Component 300 includes a substrate 301, a device 304, and electrically conductive layers 302 and 303, which are similar to substrates 101, device 104, and layers 102 and 103, respectively, of component 100 in FIG. 1. Although not portrayed in FIG. 3, component 300 also includes an encapsulant and a support substrate similar to those described earlier for components 100 and 200.

Component 300 also includes an electrical interconnect or lead 310 electrically coupled to device 304 through layer 302. Lead 310 has an electrical coupling portion 312 opposite a distal end 311. Portion 312 is shaped to maximize a coupling surface area between the bonding region of layer 302 and lead 310. Portion 312 has protrusions, fingers, or ends 314 defining slots or notches 315 therebetween. The specific configuration of ends 314 and notches 315 depicted in FIG. 3 is for illustration purposes only and is not intended to limit the scope of the present invention. Notches 315 extend beyond substrate 301 to facilitate the disposal of encapsulant (not shown) around lead 310 and substrate 301 without entrapping air.

A lead similar to lead 310 can be used to provide electrical coupling to layer 303. However, in an alternative embodiment, a wire bond or a lead similar to leads 110 or 120 of component 100 in FIG. 1 could also be used to provide electrical coupling to layer 303.

Figure 4:
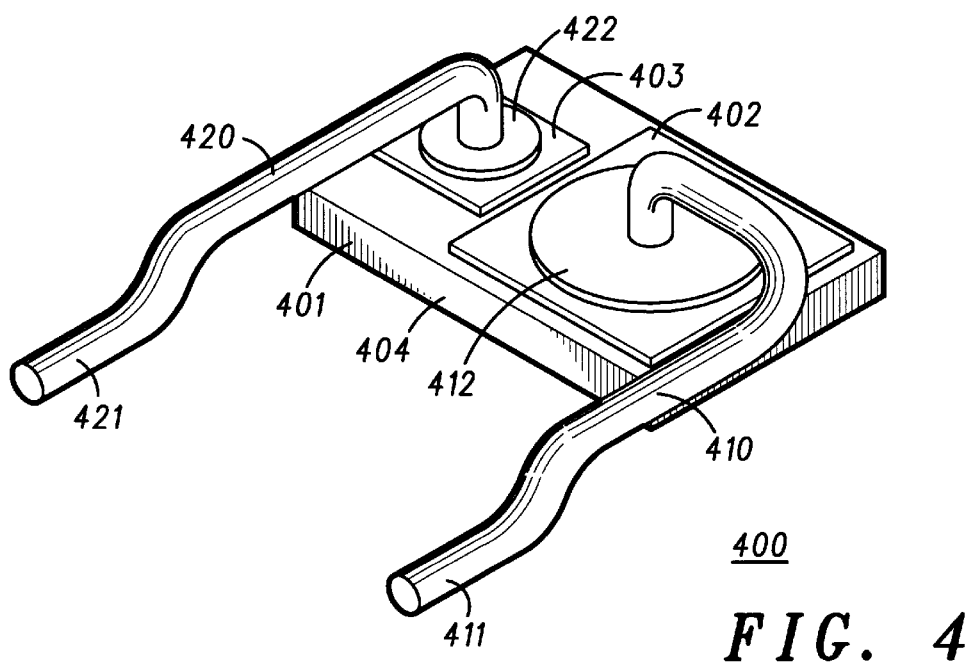
FIG. 4 illustrates an isometric view of a portion of yet another embodiment of an electronic component in accordance with the present invention.

FIG. 4 illustrates an isometric view of an electronic component 400. Component 400 includes a substrate 401, a device 404, and electrically conductive layers 402 and 403, which are similar to substrates 101, device 104, and layers 102 and 103, respectively, of component 100 in FIG. 1. Although not shown in FIG. 4, component 400 also includes an encapsulant and a support substrate similar to those described earlier for components 100 and 200.

Component 400 also has electrical interconnects or leads 410 and 420 electrically coupled to device 404 through layers 402 and 403, respectively. Leads 410 and 420 have electrical coupling portions 412 and 422, respectively, opposite distal portions 411 and 421, respectively. Portions 412 and 422 are shaped to maximize a coupling surface area between the bonding region of layer 402 and lead 410 and between the bonding region of layer 403 and lead 420.

Lead 410 is a wire that can have a circular, oval, or other curved cross-section having a cross-sectional area to provide high current carrying capabilities. In the preferred embodiment, an oval cross-section of lead 410 provides the best manufacturability for the solder reflow process used to electrically and physically couple lead 410 to layer 402. An oval cross-section of lead 410 also minimizes the stress at the interface between lead 410 and an encapsulant (not shown in FIG. 4). However, in an alternative embodiment, lead 410 can also be a ribbon having a more rectangular cross-section. Lead 420 can be similar to lead 410, but can have a smaller cross-sectional area because of the lower current carrying requirements for lead 420.

In manufacturing the preferred embodiment of component 400, leads 410 and 420 are initially drawn from a spool of wire. Then, portions 412 and 422 are deformed or flattened to be larger or wider than the other portions of leads 410 and 420, respectively, as portrayed in FIG. 4. Portions 412 and 422 are deformed to extend radially from a central portion of leads 410 and 420, respectively, wherein body or central portions of leads 410 and 420 couple distal portions 411 and 421, respectively, to portions 412 and 422, respectively. The deforming process increases a coupling surface area between lead 410 and layer 402 and between lead 420 and layer 403. This deforming process can be accomplished by, among other processes, a cold-heading process, which is known in the non-semiconductor art and non-electronic component art of making nails and screws. When a cold-heading process (instead of a stamping or coining process) is used to form portions 412 and 422, little material if any is wasted or scrapped.

In an alternative embodiment, the deformation process shapes portions 412 an 422 to each have at least one notch to improve the mold-locking characteristics of portions 412 and 422. In another alternative embodiment, portions 412 and 422 extend beyond layers 402 and 403, respectively, and even beyond substrate 401 as long as portions 412 and 422 do not electrically short together layers 402 and 403.

After the deformation process, portions 412 and 422 are electrically and physically coupled or attached to layers 402 and 403, respectively, by using solder or some other electrically conductive adhesive. In the preferred embodiment, the coupling or attaching process does not substantially deform or otherwise re-shape portions 412 and 422. Also in the preferred embodiment, the coupling or attaching process is substantially devoid of forming a eutectic or intermetallic joint, as typically formed in wire bonding applications.

Therefore, an improved electronic component is provided and overcomes the disadvantages of the prior art. The electronic component presented herein has low parasitic on-resistance because of the increased coupling surface area between the electrical interconnects and the bonding pads of the semiconductor device. The electronic component presented herein also has higher current carrying capabilities because of the larger cross-sectional areas of the electrical interconnects.

While the invention has been particularly shown and described mainly with reference to preferred embodiments, it will be understood by those skilled in the art that changes in form and detail may be made without departing from the spirit and scope of the invention. For instance, the numerous details set forth herein such as, for example, specific material compositions and mold-locking configurations are provided to merely facilitate the understanding of the present invention and are not provided to limit the scope of the invention. Furthermore, it is understood that although leads 110, 120, 210, 310, 410, and 420 are described to replace both wire bonds and leadframes, the leads described herein can also be used to merely replace wire bonds by electrically coupling a semiconductor device to a conventional leadframe. In this alternative embodiment, a lead similar to lead 110 could have portion 112 at both of its distal ends. In a different alternative embodiment, leads 110, 210, 310, or 410 can be used in a rectifier or other two terminal device or in an integrated circuit.

Accordingly, the disclosure of the present invention is not intended to be limiting. Instead, the disclosure of the present invention is intended to be merely illustrative of the scope of the invention, which is set forth in the following claims.

What is claimed is:

1. An electronic component comprising:
   a substrate;
   an electrically conductive layer supported by the substrate, the electrically conductive layer having an electrical coupling portion;
   an electrical interconnect having an electrical coupling portion coupled to and overlying the electrical coupling portion of the electrically conductive layer wherein the electrical coupling portion of the electrical interconnect has at least one notch adjacent to the electrically conductive layer and a perimeter of the electrical coupling portion of the electrical interconnect, wherein the electrical coupling portion of the electrical interconnect has a hole; and
   an additional electrical interconnect inserted into the hole of the electrical coupling portion of the electrical interconnect, wherein the electrical interconnect and the additional electrical interconnect are electrically isolated from each other.

2. The electronic component of claim 1 further comprising a packaging material covering the substrate, the electrically conductive layer, and the electrical coupling portion of the electrical interconnect,
   wherein the substrate is comprised of a semiconductor substrate, and
   wherein a distal portion of the electrical interconnect extends out of the packaging material.

3. The electronic component of claim 2 wherein the electrical coupling portion of the electrical interconnect has a plurality of ends defining the at least one notch.

4. The electronic component of claim 3 wherein at least one of the plurality of ends is bent away from the electrically conductive layer and the substrate.

5. The electronic component of claim 2 wherein the distal portion of the electrical interconnect and the electrical coupling portion of the electrical interconnect are at opposite ends of the electrical interconnect and wherein the electrical coupling portion of the electrical interconnect is larger than the electrical coupling portion of the electrically conductive layer.

6. The electronic component of claim 2 wherein the at least one notch maintains an orientation of the electrical interconnect relative to the substrate.

7. The electronic component of claim 6 wherein the at least one notch extends beyond the electrical coupling portion of the electrically conductive layer.

8. The electronic component of claim 2 wherein the electrical coupling portion of the electrical interconnect is wider than the distal portion of the electrical interconnect, wherein the electrical coupling portion of the electrical interconnect extends radially from a central portion of the electrical interconnect, and wherein the central portion of the electrical interconnect couples the distal portion to the electrical coupling portion of the electrical interconnect.

9. The electronic component of claim 1 wherein the electrical coupling portion of the electrical interconnect is wider than a different portion of the electrical interconnect.

10. The electronic component of claim 1 wherein the electrical coupling portion of the electrical interconnect is larger than the electrical coupling portion of the electrically conductive layer.

11. The electronic component of claim 1 further comprising an additional electrically conductive layer supported by the substrate,
- wherein the electrically conductive layer has a hole,
- wherein the additional electrically conductive layer is located in the hole of the electrically conductive layer,
- wherein the hole of the electrical interconnect exposes the additional electrically conductive layer, and
- wherein the additional electrical interconnect is coupled to the additional electrically conductive layer through the hole of the electrical interconnect.

12. A semiconductor component comprising:
- a semiconductor substrate;
- an electrically conductive layer supported by the semiconductor substrate; and
- an electrical interconnect having an electrical coupling portion coupled to and overlying the electrically conductive layer;
- wherein the electrical coupling portion of the electrical interconnect has a pllurality of protrusions coupled to the electrically conductive layer; and
- wherein each of the plurality of protrusions has a surface substantially coplanar to each other and substantially parallel with the electrically conductive layer in order to maximize a coupling surface area between the plurality of protrusions and the electrically conductive layer.

13. The semiconductor component of claim 12 wherein the electrical coupling portion is wider than other portions of the electrical interconnect.

14. The semiconductor component of claim 12 wherein a surface area of the electrical coupling portion is within thirty percent of a surface area of a contact region of the electrically conductive layer.

15. The semiconductor component of claim 12 wherein the electrical coupling portion has a plurality of notches between the plurality of protrusions wherein the plurality of notches extend beyond the semiconductor substrate.

16. A semiconductor component comprising:
- a support substrate having an electrically conductive mounting region;
- a semiconductor substrate mounted over and electrically coupled to the electrically conductive mounting region, the semiconductor substrate having a surface facing away from the support substrate, and the support substrate larger than the semiconductor substrate;
- a transistor in the surface;
- a metal layer supported by the surface and divided into first and second bonding regions physically separated from each other and electrically coupled to the transistor;
- an electrical lead supported by the first bonding region and electrically coupled to the first bonding region, the electrical lead having a plurality of protrusions adjacent to the metal layer wherein each of the plurality of protrusions have a surface substantially parallel with the first bonding region; and
- an encapsulant surrounding the semiconductor substrate, the metal layer, and the plurality of protrusions of the electrical lead wherein the support substrate supports the encapsulant and wherein an end portion of the electrical lead extends out of the encapsulant.

17. The semiconductor component of claim 16 wherein a bonding surface of the electrical lead is coupled to the first bonding region and is devoid of covering any portion of the second bonding region, wherein the surface of the plurality of protrusions forms a portion of the bonding surface, and wherein the metal layer is comprised of solder.

18. The semiconductor component of claim 16 wherein the electrical lead has a through-hole at the first bonding region.

* * * * *